United States Patent [19]

Nagata

[11] Patent Number: 5,986,966
[45] Date of Patent: Nov. 16, 1999

[54] SEMICONDUCTOR MEMORY DEVICE CAPABLE OF EFFECTIVELY RESETTING SUB WORD LINES

[75] Inventor: Kyoichi Nagata, Tokyo, Japan

[73] Assignee: NEC Corporation, Tokyo, Japan

[21] Appl. No.: 09/055,956

[22] Filed: Apr. 7, 1998

[30] Foreign Application Priority Data

Apr. 7, 1997 [JP] Japan .................................. 9-088145

[51] Int. Cl.⁶ ...................................................... G11C 7/00
[52] U.S. Cl. ................................ 365/230.06; 365/230.03; 365/63
[58] Field of Search .................. 365/230.06, 230.03, 365/230.04, 52, 63

[56] References Cited

FOREIGN PATENT DOCUMENTS 60-167193  8/1985  Japan .
4-32091    2/1992  Japan .

OTHER PUBLICATIONS

T. Saeki et al., "A 2.5ns Clock Access 250MHz 256Mb SDRAM With A Synchronous Mirror Delay", *IEEE International Solid–State Circuits Conference*, pp. 474–476, (1996).

*Primary Examiner*—Vu A. Le
*Attorney, Agent, or Firm*—Foley & Lardner

[57] ABSTRACT

In a semiconductor memory device, a plurality of main word lines a plurality of pairs of first and second sub word lines, a plurality of first sub word line drive circuits and a plurality of second sub word line drive circuits are provided. Each of the first word line drive circuits is connected to one of the main word lines and at least two pairs of the pairs of first and second sub word lines for activating and deactivating one of the first sub word lines and deactivating the second sub word lines. Each of the second sub word line drive circuits is connected to one of the main word lines and at least two pairs of the pairs of first and second sub word lines for activating and deactivating one of the second sub word lines and deactivating the first sun word lines.

10 Claims, 14 Drawing Sheets

Fig. 5 PRIOR ART

| | WD0 | WD1 | WD2 | WD3 |
|---|---|---|---|---|
| MWL0 | SWL0 | SWL1 | SWL2 | SWL0 |
| MWL1 | SWL4 | SWL5 | SWL6 | SWL1 |
| MWL2 | SWL8 | SWL9 | SWL6 | WL2 |
| ...... | ...... | ...... | ...... | ...... |
| MWLi | SWL4i | SWL(4i+1) | SWL(4i+2) | SWL(4i+3) |
| ...... | ...... | ...... | ...... | ...... |

SEMICONDUCTOR MEMORY DEVICE CAPABLE OF EFFECTIVELY RESETTING SUB WORD LINES

BACKGROUND OF THE INVENTION

1. Field of the Invention

The present invention relates to a semiconductor memory device where word lines are divided into sub word lines.

2. Description of the Related Art

As semiconductor memory devices such as dynamic random access memory (DRAM) devices have been highly integrated, the number of memory cells connected to one word line has been increased, which increases the load of the word line.

In a prior art DRAM device, in order to decrease the load of word lines, each of the word lines are divided into a plurality of sub word lines. In other words, a plurality of sub word lines are under one main word line. This will be explained later in detail.

Even in the prior art device, when the number of memory cells connected to one sub word line is increased, the length of the sub word line is increased so that the load thereof is increased. As a result, rising and falling of the voltage at the terminal of the sub word line opposite to a corresponding sub word line drive circuit is remarkably delayed, which decreases the access speed.

In order to increase the access speed, an additional reset transistor may be connected to the terminal of the sub word line (see JP-A-60-167193). In this case, however, the connections for the additional reset transistors are required, which increases the chip area and decreases the integration.

SUMMARY OF THE INVENTION

It is an object of the present invention to provide a semiconductor memory device capable of effectively resetting (deactivating) sub word lines without special connections.

According to the present invention, in a semiconductor memory device, a plurality of main word lines, a plurality of pairs of first and second sub word lines, a plurality of first sub word line drive circuits and a plurality of second sub word line drive circuits are provided. Each of the first word line drive circuits is connected to one of the main word lines and at least two pairs of the pairs of first and second sub word lines for activating and deactivating one of the first sub word lines and deactivating the second sub word lines. Each of the second sub word line drive circuits is connected to one of the main word lines and at least two pairs of the pairs of first and second sub word lines for activating and deactivating one of the second sub word lines and deactivating the first sub word lines.

The sub word lines can be deactivated on both sides thereof by the first and second sub word line drive circuits.

BRIEF DESCRIPTION OF THE DRAWINGS

The present invention will be more clearly understood from the description as set forth below, as compared with the prior art, with reference to the accompanying drawings, wherein:

FIG. 5 is a table showing the operation of the device of FIG. 1;

DESCRIPTION OF THE PREFERRED EMBODIMENTS

Before the description of the preferred embodiments, a prior art DRAM device will be explained with reference to FIGS. 1, 2, 3, 4, and 5.

Figure 1:
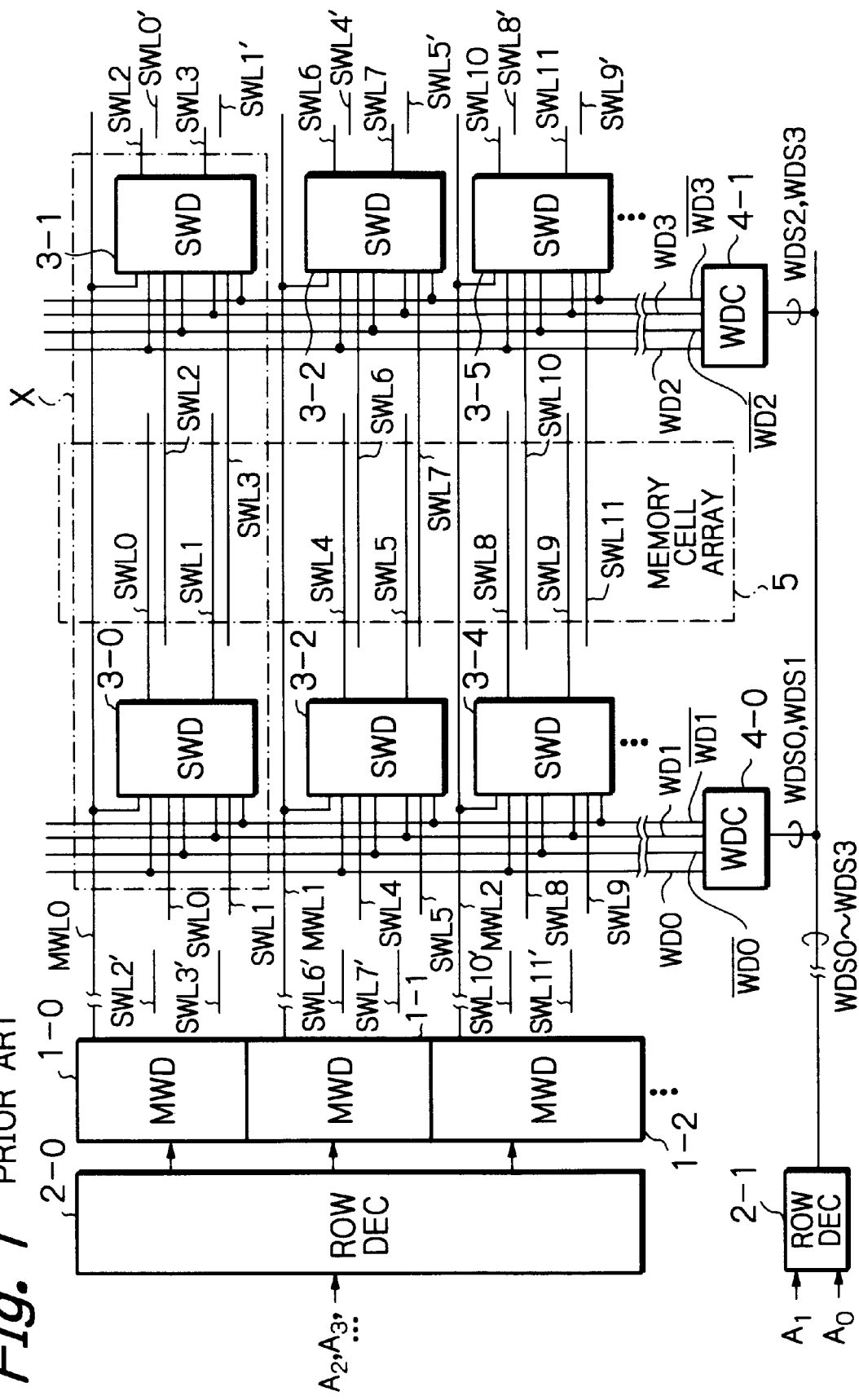
FIG. 1 is a block circuit diagram illustrating a prior art DRAM device.

In FIG. 1, which illustrates a DRAM device, main word lines MWL1, MWL1, . . . and sub word lines SWL0, SWL1, . . . are provided. Note that, the sub word lines SWL0, SWL1, SWL2, and SWL3 are under the main word line MWL0, for example. Generally, the sub word lines SWL(4i), SWL(4i+1), SWL(4i+2) and SWL(4i+3) are under the main word line MWLi.

The main word lines MWL0, MWL1, . . . are driven by main word drive circuits 1-0, 1-1, . . . , respectively, which receive main word line selection signals from a row decoder 2-0.

The sub word lines SWL0, SWL1, . . . are driven by sub word line drive circuits 3-0, 3-1, . . . . In this case, one of the four sub word lines such as SWL0, SWL1, SWL2 and SWL3 is selected and driven by two of the sub word line drive circuits such as 3-0 and 3-1. In more detail, one of the sub word lines SWL0 and SWL 1 is selected and driven by the sub word line drive circuit 3-0, while one of the sub word lines such as SWL2 and SWL3 is selected and driven by the sub word line drive circuit 3-1.

The sub word line drive circuits 3-0 and 3-1 are controlled by the main word line drive circuit 1-0; the sub word line drive circuits 3-2 and 3-3 are controlled by the main word line drive circuit 1-1; and the like. Also, the sub word line drive circuits 3-0, 3-2, . . . are controlled by a sub word line drive signal control circuit 4-0, and the sub word line drive circuits 3-1, 3-3, . . . are controlled by a sub word line drive signal control circuit 4-1.

The word line drive control circuits 4-0 and 4-1 receive sub word line selection signals WDS0, WDS1, WDS2 and WDS3 from a row decoder 2-1. In this case, the word line drive control circuit 4-0 generates complementary word drive signals WD0 and $\overline{WD0}$ and complementary word drive signals WD1 and $\overline{WD1}$ in accordance with the sub word line selection signals WDS0 and WDS1, and the word line drive control circuit 4-1 generates complementary word drive signals WD2 and $\overline{WD2}$ and complementary word drive signals WD3 and $\overline{WD3}$ in accordance with the sub word line selection signals WDS2 and WDS3.

Note that the row decoder 2-1 receives two lower bits $A_0$ and $A_1$ of a row address signal, and the row decoder 2-0 receives the other higher bits $A_2, A_3, \ldots$ of the row address signal.

Also, reference numeral 5 designates a memory cell array formed by one-transistor, one-capacitor type memory cells (not shown) connected between the sub word lines SWL0, SWL1, ... and bit lines (not shown).

Figure 2:
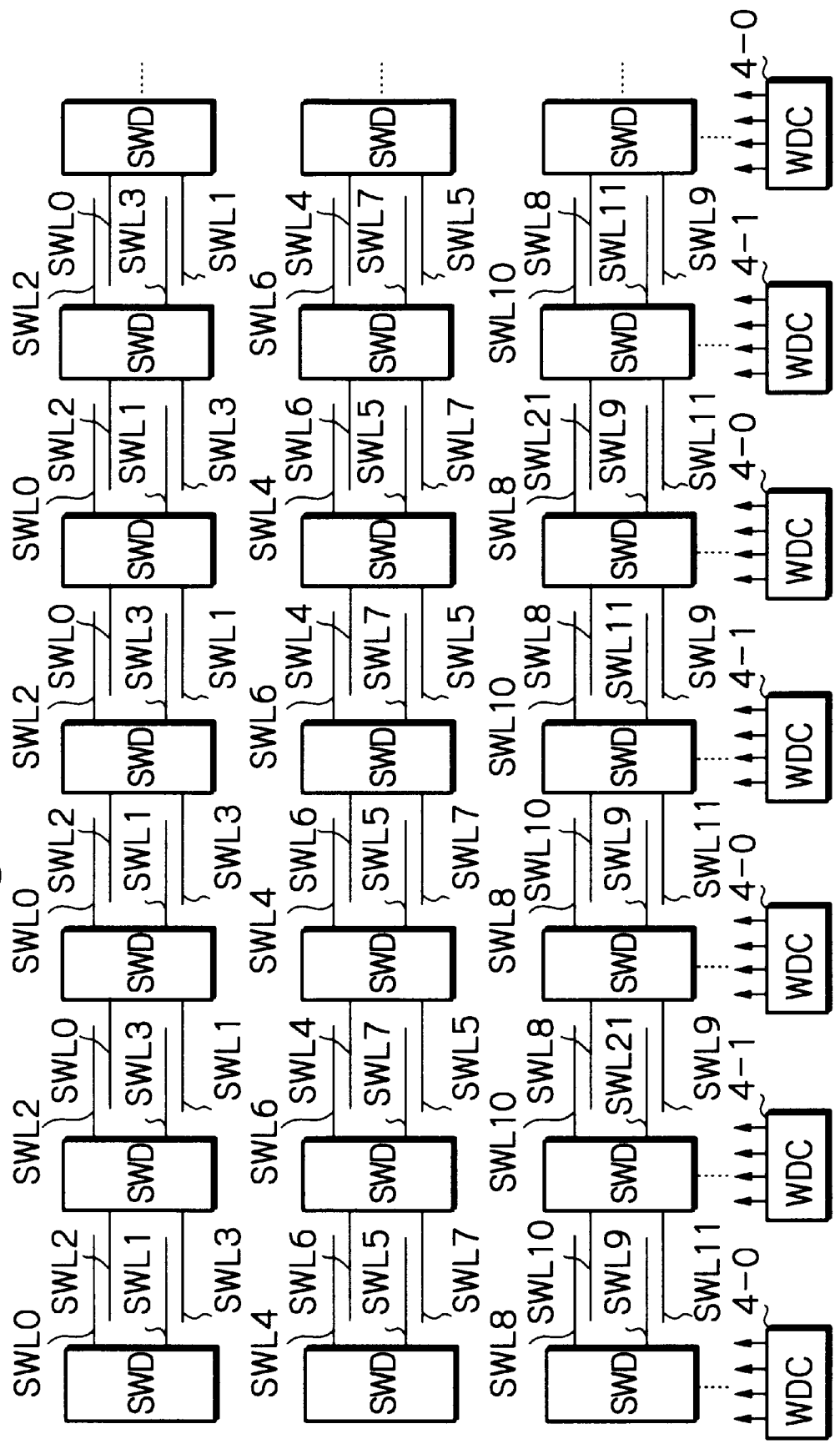
FIG. 2 is a block circuit diagram illustrating a modification of the device of FIG. 1.

Note that sub word lines SWL0', SWL1', ... have the same voltages as the sub word lines SWL0, SWL1, ..., respectively. That is, actually, as illustrated in FIG. 2, a plurality of memory cell arrays are provided, and each of the memory cell arrays is sandwiched by two columns of sub word line drive circuits (see T. Saeki et al., "A 2.5 ns Clock Access 250MH$_z$ 256 Mb SDRAM with Synchronous Mirror Delay", IEEE International Solid-State Circuits Conference, pp. 474–476, February 1996).

The sub word line drive circuits 3-0 and 3-1 of FIG. 1 are explained next with reference to FIG. 3 which is a detailed circuit diagram of a circuit indicated by X in FIG. 1.

The sub word line drive circuit 3-0 is formed by a circuit including transistors Q01, Q02, Q03 and Q04 for the sub word line SWL0 and a circuit including transistors Q11, Q12, Q13 and Q14 for the sub word line SWL1. Similarly, the sub word line drive circuit 3-1 is formed by a circuit including transistors Q21, Q22, Q23 and Q24 for the sub word line SWL2 and a circuit including transistors Q31, Q32, Q33 and Q34 for the sub word line SWL3. The transistors Qi3, and Qi3, (i=0, 1, 2, 3) are used for pulling up the voltage at the sub word line SWLi, and the transistor Qi4 is used for pulling down the voltage at the sub word line SWLi. In this case, a bootstrapped voltage VBOOT ($>V_{cc}+\alpha$) is applied to the gates of the transistors Q03, Q13, Q23 and Q33, and as a result, the voltages at the sub word lines SWL0, SWL1, SWL2 and SWL3 can be completely pulled up to $V_{cc}$. Also, the transistors Q02, Q12, Q22 and Q32 are used for clamping the non-selected sub word lines at the ground level GND.

Figure 3:
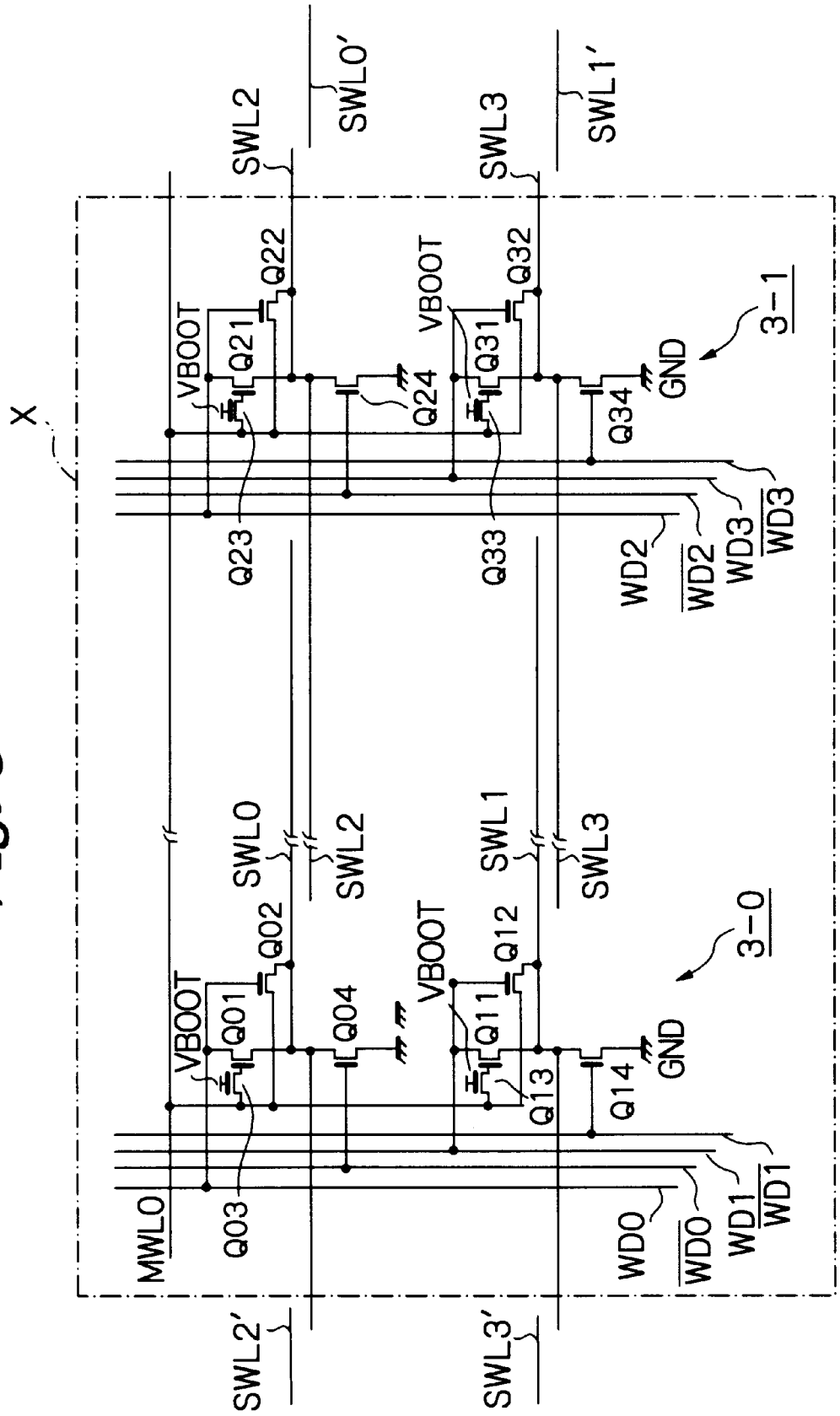
FIG. 3 is a detailed circuit diagram of the circuit X of FIG. 1.
Figure 4:
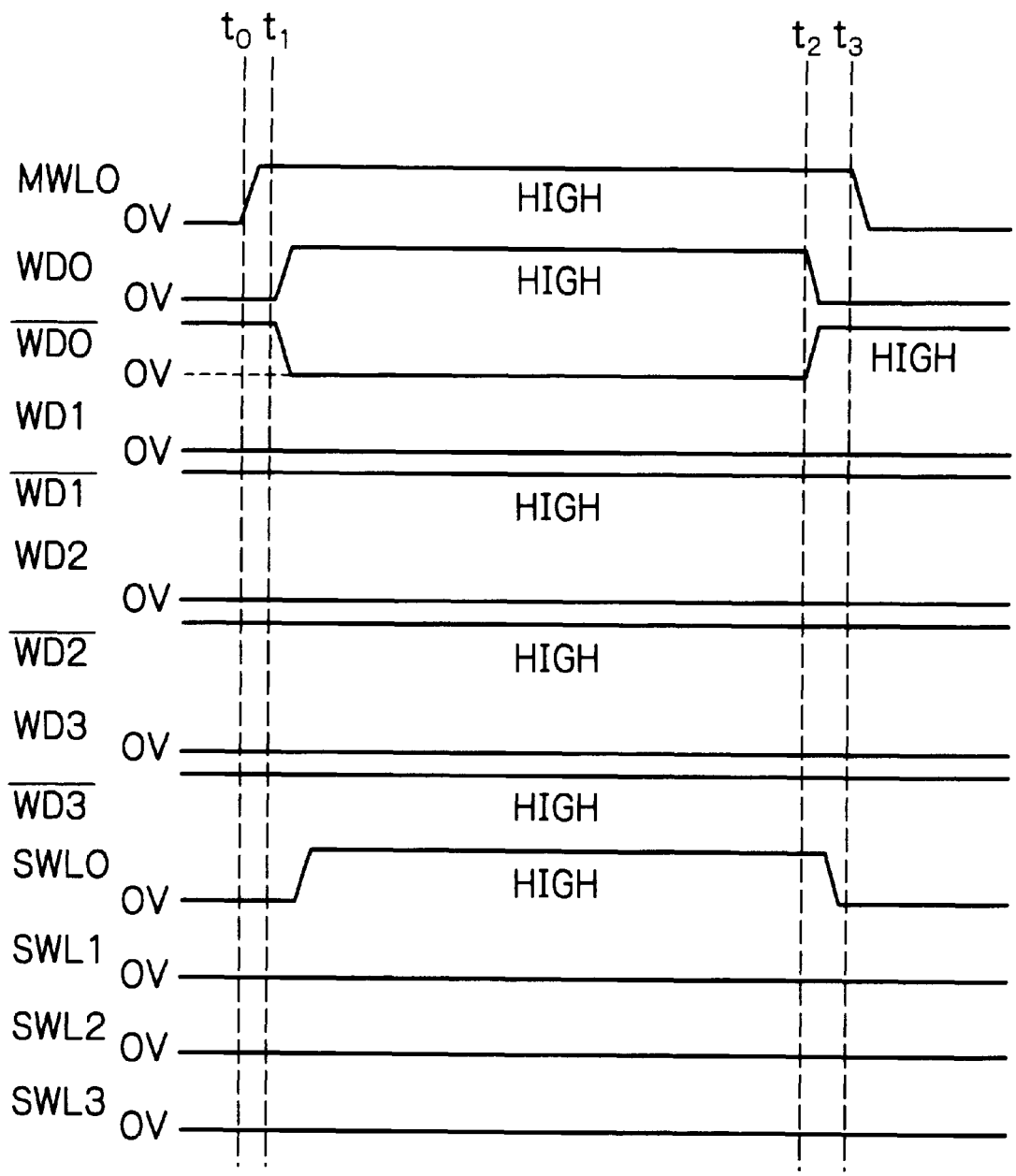
FIG. 4 is a timing diagram showing the operation of the device of FIG. 3.

The operation of the circuit of FIG. 3 is explained next with reference to FIG. 4. In FIG. 4, assume that the sub word line SWL0 is to be selected.

First, at time t0, the voltage at the main word line MWL0 is caused to go from 0 V to a high level ($>V_{cc}$). Therefore, the voltages at the gates of the transistors Q01, Q11, Q21 and Q31 are increased by the voltage at the main word line MWL0 through the transistors Q03, Q13, Q23 and Q33, so that the transistors Q01, Q11, Q21, and Q31 and turned ON.

Next, at time t1, the voltage at the sub word drive signal WD0 rises and the voltage at the sub word drive signal $\overline{WD0}$ falls. Therefore, the transistors Q01 and Q02 are turned ON while the transistor Q04 is turned OFF. In this case, since the voltage at the gate of the transistor Q01 is high by the voltage at the main word line MWL0, the voltage at the gate of the transistor Q01 is boosted due to the presence of the transistor Q03 in accordance with the rise of the voltage of the sub word drive signal WD0. As a result, the sub word line SWL0 is activated, i.e., the voltage at the sub word line SWL0 is increased from the ground level GND to a high level the same as that of the sub word line drive signal WD0. On the other hand, in this case, since the voltages of the sub word line drive signals $\overline{WD1}$, $\overline{WD2}$ and $\overline{WD3}$ remain high, the transistors Q14, Q24 and Q34 are turned ON. In addition, since the sub word line drive signals WD1, WD2 and WD3 whose voltages are 0 V are supplied by the turned ON transistors Q11, Q21 and Q31 to the sub word lines SWL1, SWL2 and SWL3, respectively, the voltages at the sub word lines SWL1, SWL2 and SWL3 remain at 0 V.

Next, at time t2, the voltage of the sub word line drive signal WD0 falls and the voltage of the sub word line drive signal $\overline{WD0}$ rises. Therefore the transistor Q02 is turned OFF and the transistor Q04 is turned ON, and as a result, the sub word line SWL0 is deactivated, i.e., the voltage of the sub word line SWL0 is pulled down to 0 V.

Finally, at time t3, the voltage at the main word line MWL0 is caused to go from the high level to 0 V. As a result, the transistors Q01, Q02, Q03 and Q04 are turned OFF.

Generally, in the DRAM device of FIG. 1, one of the sub word lines SWL0, SWL1, ... is selected and is caused to be a high level in accordance with the voltages at the main word line MWL0, MWL1, ... and the sub word line drive signals WD0, WD1, ..., as shown in FIG. 5.

Even in the DRAM device of FIG. 1, when the number of memory cells connected to one sub word line is increased the length of the sub word line is increased so that the load thereof is increased. As a result, rising and falling of the voltage at the terminal of the sub word line opposite to the corresponding sub word line drive circuit is remarkably delayed, which decreases the access speed.

In order to increase the access speed, an additional reset transistor may be connected to the terminal of the sub word line (see JP-A-60-167193). In this case, however, the connections for the additional reset transistors are required, which increases the chip area and decreases the integration.

Figure 6:
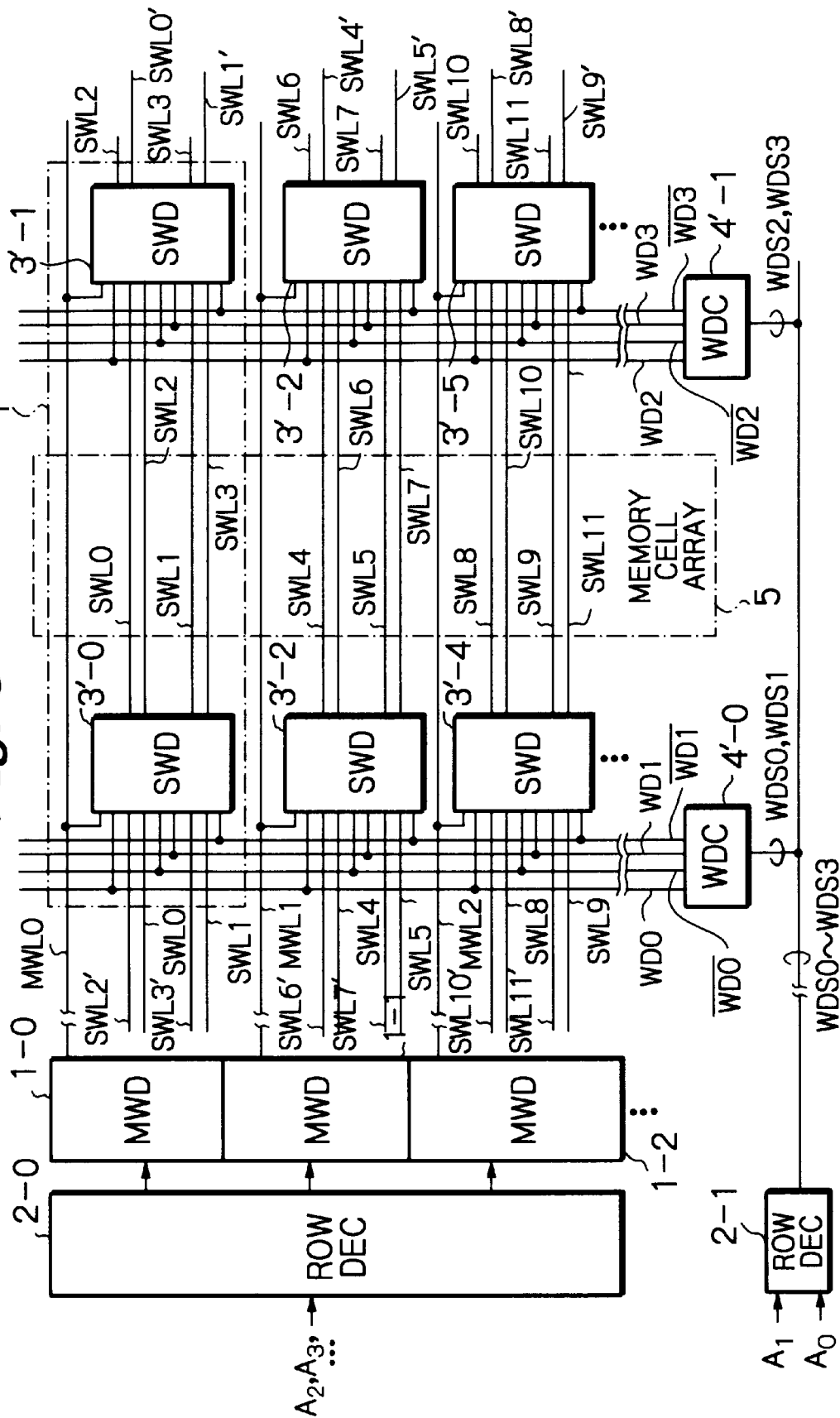
FIG. 6 is a block circuit diagram illustrating a first embodiment of the DRAM device according to the present invention.

In FIG. 6, which illustrates a first embodiment of the present invention, sub word line drive circuits 3'-0, 3'-1, ... are provided instead of the sub word line drive circuits 3-0, 3-1, ... of FIG. 1. Also, each of the sub word lines SWL0, SWL1, ... is connected to two of the sub word line drive circuits 3'-0, 3'-1, .... In other words, each of the sub word line drive circuits 3'-0, 3'-1, ... is connected to the sub word lines on the both sides thereof. For example, the sub word line drive circuit 3'-0 is connected to the sub word lines SWL0 (SWL0') and SWL1 (SWL1') for driving and resetting the sub word lines SWL0 (SWL0') and SWL1 (SWL1'), and the sub word line drive circuit 3'-0 is connected to the sub word lines SWL2 (SWL2') and SWL3 (SWL3') only for resetting the sub word lines SWL2 (SWL2') and SWL3 (SWL3'). Further, sub word line drive signal control circuits 4'-0 and 4'-1 are provided instead of the sub word line drive signal control circuits 4-0 and 4-1, respectively, of FIG. 1.

The sub word line drive circuits 3'-0 and 3'-1 of FIG. 6 are explained next with reference to FIG. 7 which is a detailed circuit diagram of a circuit indicated by Y in FIG. 6.

The sub word line drive circuit 3'-0 includes transistors Q05, Q06, Q15, and Q16 in addition to the elements of the sub word line drive circuit 3-0 of FIG. 3. Also, the sub word line drive circuit 3'-1 includes transistors Q25, Q26, Q35 and Q36 in addition to the elements of the sub word line drive circuit 3-1 of FIG. 3. In this case, the transistors Q05, Q15, Q25 and Q35 are used for resetting the selected sub word lines, and the transistors Q06, Q16, Q26, and Q36 are used for clamping the non-selected sub word lines at the ground level GND.

Figure 8A:
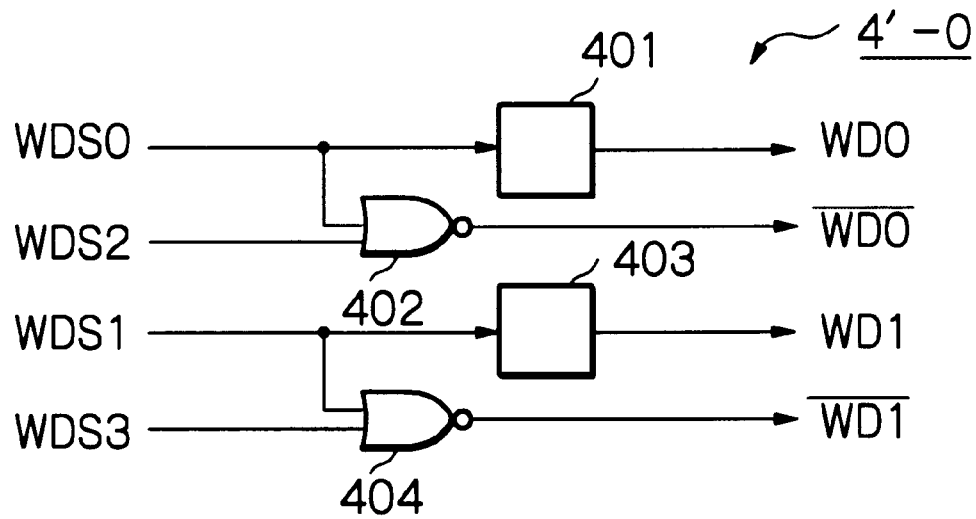
FIG. 8A and 8B are circuit diagrams of the sub word line drive signal control circuits of FIG. 6.

In FIG. 8A, which is a detailed circuit diagram of the sub word line drive signal control circuit 4'-0 of FIG. 6, the sub word line drive signal WD0 is generated from a voltage buffer 401 which receives the sub word line selection signal WDS0, while the sub word line drive signal $\overline{WD0}$ is generated from a NOR circuit 402 which receives the sub word line selection signal WDS2 as well as the sub word line selection signal WDS0. Similarly, the sub word line drive signal WD1 is generated from a voltage buffer 403 which receives the sub word line selection signal WDS1, while the sub word line drive signal $\overline{WD1}$ is generated from a NOR circuit 404 which receives the sub word line selection signal WDS3 as well as the sub word line selection signal WDS1.

Figure 8B:
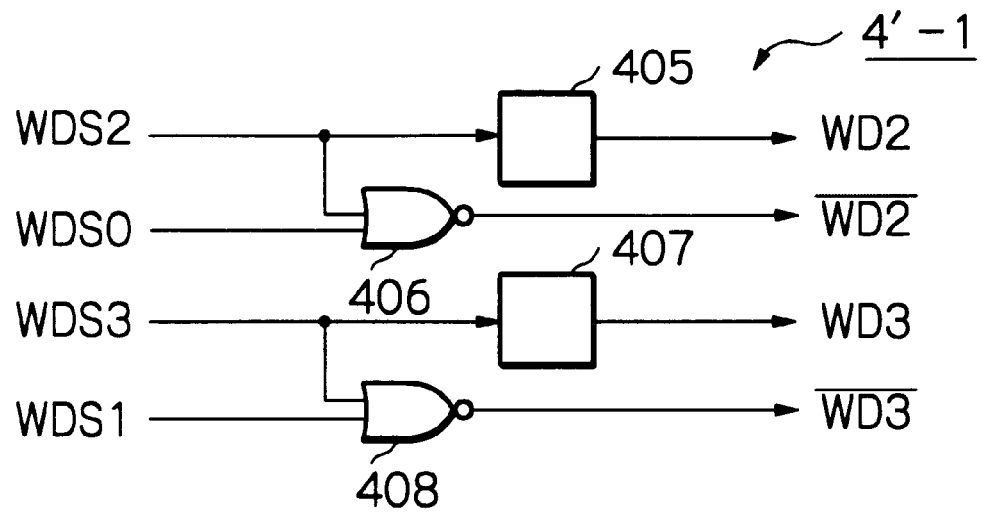

In FIG. 8B, which is a detailed circuit diagram of the sub word line drive signal control circuit 4'-1 of FIG. 6, the sub word line drive signal WD2 is generated from a voltage buffer 405 which receives the sub word line selection signal WDS2, while the sub word line drive signal $\overline{WD2}$ is generated from a NOR circuit 406 which receives the sub word line selection signal WDS0 as well as the sub word line selection signal WDS2. Similarly, the sub word line drive signal WD3 is generated from a voltage buffer 407 which receives the sub word line selection signal WDS3, while the sub word line drive signal $\overline{WD3}$ is generated from a NOR circuit 408 which receives the sub word line selection signal WDS1 as well as the sub word line selection signal WDS3.

Figure 7:
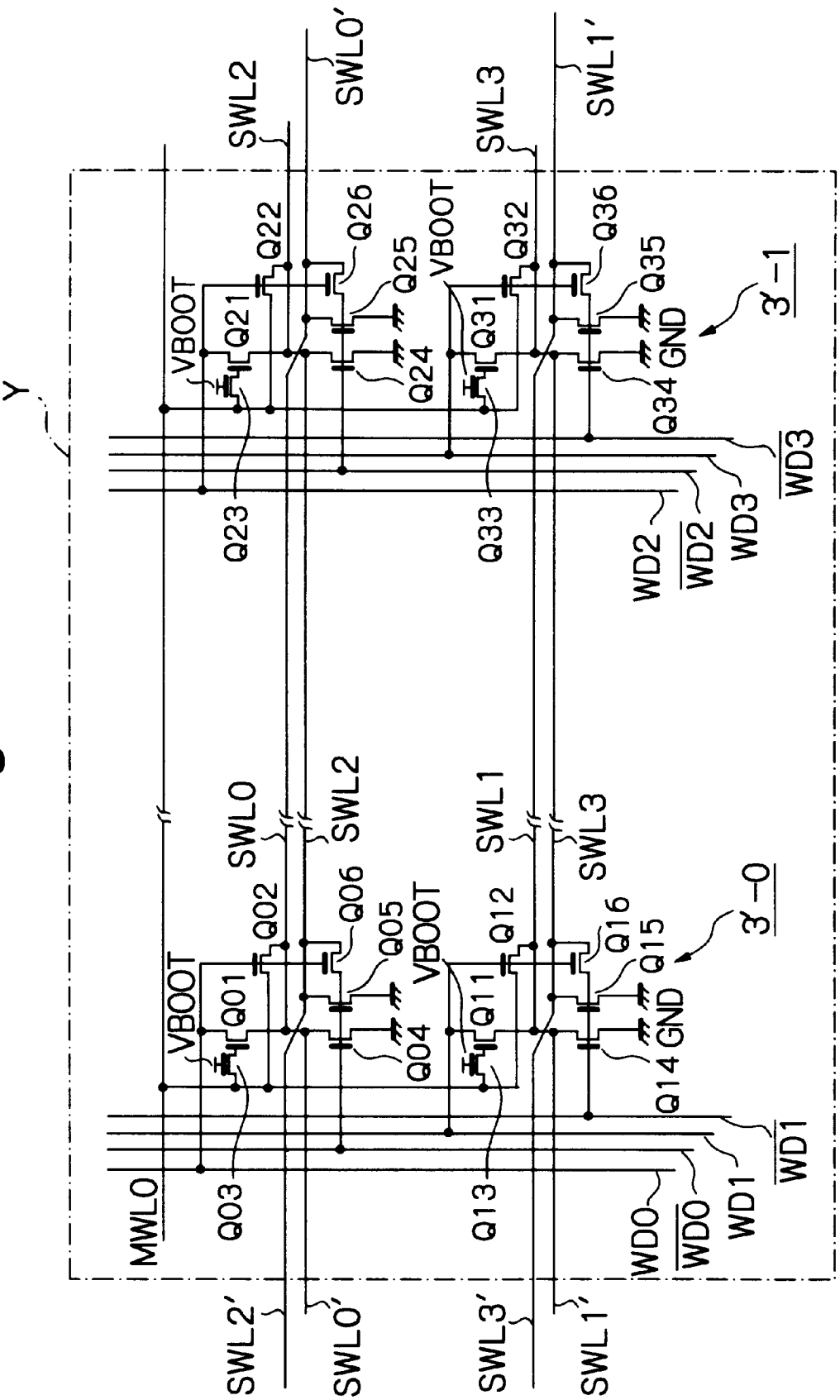
FIG. 7 is a detailed circuit diagram of the circuit Y of FIG. 6.
Figure 9:
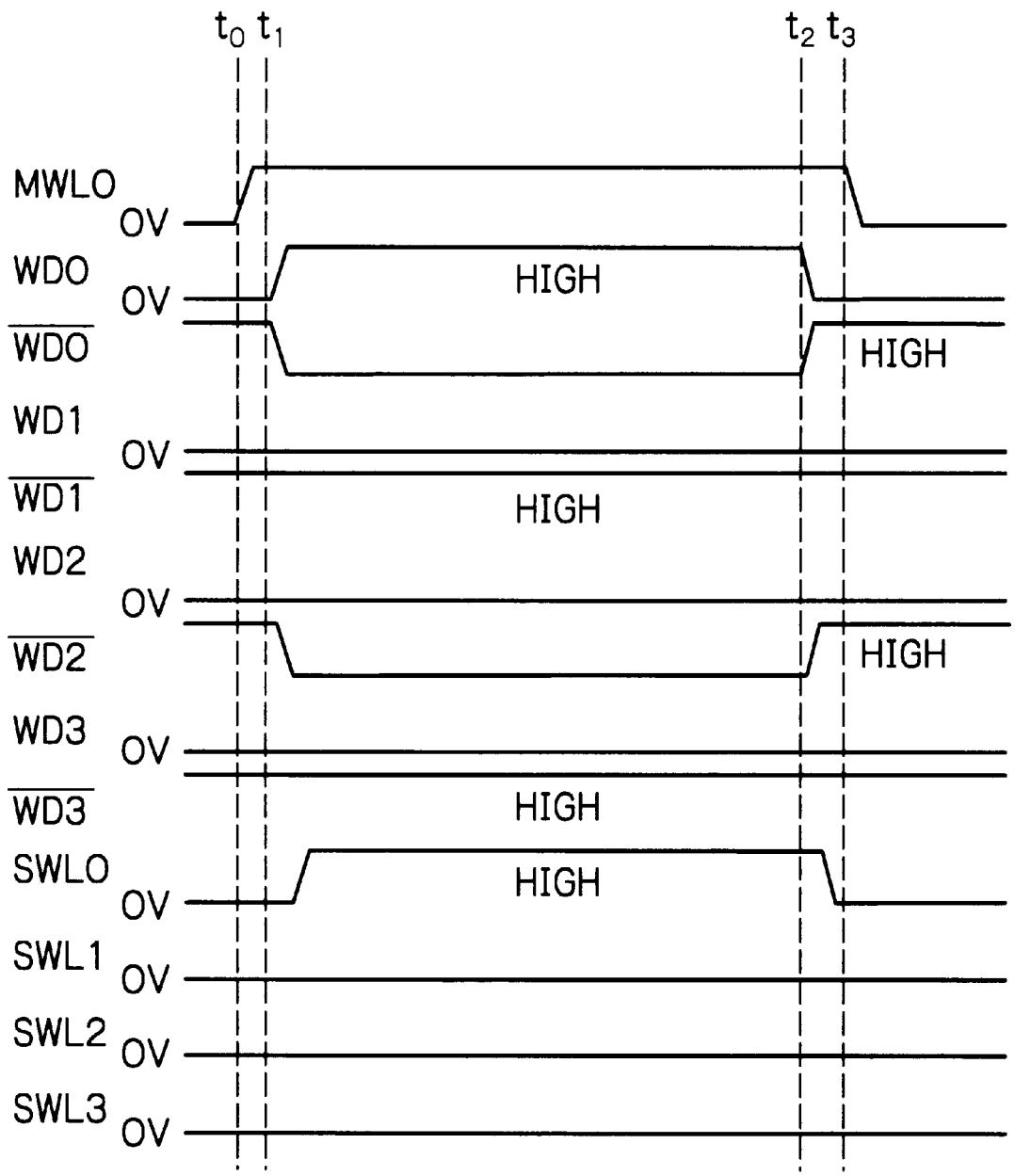
FIG. 9 and 10 are timing diagrams showing the operation of the device of FIG. 7.

The operation of the circuit of FIG. 7 is explained next with reference to FIG. 9. In FIG. 9, assume that the sub word line SWL0 is to be selected.

First, at time t0, the voltage at the main word line MWL0 is caused to go from 0 V to a high level (>$V_{cc}$). Therefore, the voltages at the gates of the transistors Q01, Q11, Q21 and Q31 are increased by the voltage at the main word line MWL0 through the transistors Q03, Q13, Q23 and Q33, so that the transistors Q01, Q11, Q21 and Q31 are turned ON.

Next, at time t1, the voltage of the sub word drive signal WD0 rises and the voltages of the sub word drive signals $\overline{WD0}$ and $\overline{WD2}$ fall. Therefore, the transistors Q01 and Q02 are turned ON while the transistors Q04, Q05, Q24 and Q25 are turned OFF. In this case, since the voltage at the gate of the transistor Q01 is high by the voltage at the main word line MWL0, the voltage at the gate of the transistor Q01 is boosted due to the presence of the transistor Q03 in accordance with the rise of the voltage of the sub word drive signal WD0. As a result, the sub word line SWL0 is activated, i.e., the voltage at the sub word line SWL0 is increased from the ground level GND to a high level the same as that of the sub word line drive signal WD0. On the other hand, in this case, since the voltages of the sub word line drive signals $\overline{WD1}$ and $\overline{WD3}$ remains high, the transistors Q14, Q15, Q34 and Q35 are turned ON. In addition, since the sub word line drive signals WD1, WD2 and WD3 whose voltages are 0 V are supplied by the turned ON transistors Q11, Q21 and Q31 to the sub word lines SWL1, SWL2 and SWL3, respectively, the voltages of the sub word lines SWL1, SWL2 and SWL3 remain at 0 V.

Next, at time t2, the voltage of the sub word line drive signal WD0 falls and the voltages of the sub word line drive signal $\overline{WD0}$ and $\overline{WD2}$ rise. Therefore, the transistors Q02 and Q06 are turned OFF and the transistors Q04, Q05, Q24 and Q25 are turned ON. As a result, charges flow from the sub word line SWL0 via the transistor Q01 to the line of the sub word line drive signal WD0 and also flow from the sub word line SWL0 via the transistor Q06 to the ground level GND, so that the sub word line SWL0 around the sub word line drive circuit 3'-0 is clamped to the ground level GND. Simultaneously, charges flow from the sub word line SWL0 via the transistor Q25 to the ground level GND, so that the sub word line SWL0 around the sub word line drive circuit 3'-1 is clamped to the ground level GND. Thus, the voltage at the sub word line SWL0 is rapidly pulled down to 0 V, i.e., the sub word line SWL0 is deactivated.

Finally, at time t3, the voltage at the main word line MWL0 is caused to go from the high level to 0 V. As a result, the transistors Q01, Q11, and Q21 and Q31 are turned OFF. In this case, since the voltages of the sub word line drive signals $\overline{WD0}$, $\overline{WD1}$, $\overline{WD2}$ and $\overline{WD3}$ are high, the transistors Q04, Q05, Q14, Q15, Q24, Q25, Q34 and Q35 are turned ON. Thus, the fluctuation of the voltage at the sub word line SWL0 around the sub word line drive circuit 3'-1 due to the noise is suppressed, so that the sub word line SWL0 can be securely clamped to the ground level GND.

Figure 10:
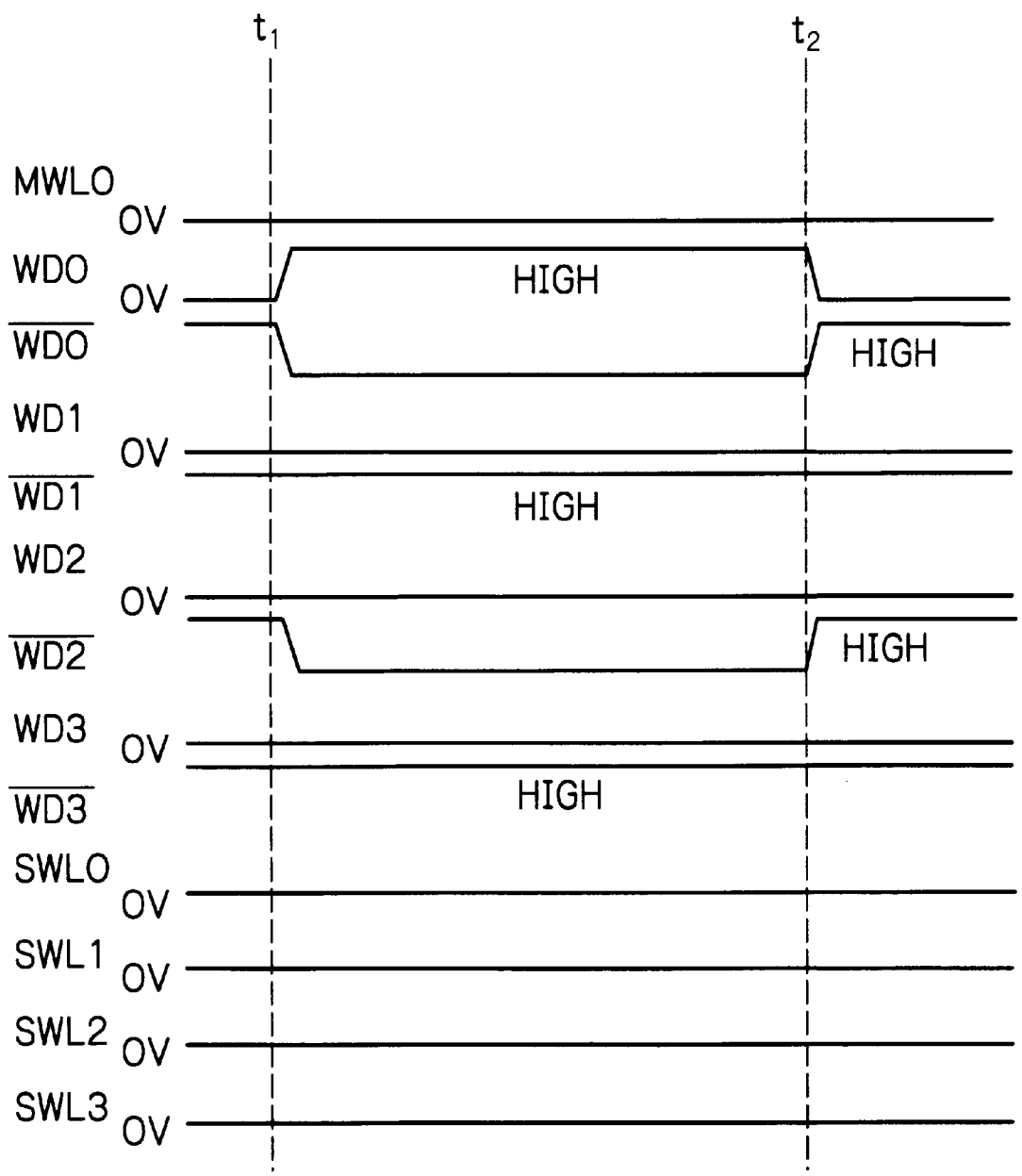

The operation of the circuit of FIG. 7 is explained next with reference to FIG. 10. In FIG. 10, assume that the main word line MWL0 is not selected.

First, at time t1, the voltage at the sub word drive signal WD0 rises and the voltages of the sub word drive signal $\overline{WD0}$ and $\overline{WD2}$ fall. Therefore, the transistor Q02 and Q06 is turned ON while the transistors Q04, Q05, Q24 and Q25 are turned OFF. In this case, since the voltage at the main word line MWL0 is 0 V, the transistors Q01, Q11, Q21 and Q31 are turned OFF. The sub word line SWL0 is clamped by the turned ON transistor Q02 to the ground level GND. Also, the sub word line SWL1 is clamped by the turned ON transistors Q14 and Q35 to the ground level GND. Further, the sub word line SWL2 is clamped by the turned ON transistor Q05 to the ground level GND. Still further, the sub word line SWL3 is clamped by the turned ON transistors Q15 and Q34 to the ground level GND.

Finally, at time t2, the voltage of the sub word line drive signal WD0 falls and the voltages of the sub word line drive signals $\overline{WD0}$ and $\overline{WD2}$ rise. In this case, since the voltages of the sub word line drive signals $\overline{WD0}$, $\overline{WD1}$, $\overline{WD2}$ and $\overline{WD3}$ are high, the transistors Q04, Q05, Q14, Q15, Q24, Q25, Q34 and Q35 are turned ON. Thus, the fluctuation of the voltage at the sub word line SWL0 around the sub word line drive circuit 3'-1 due to the noise is suppressed, so that the sub word line SWL0 can be securely clamped to the ground level GND.

Figure 11:
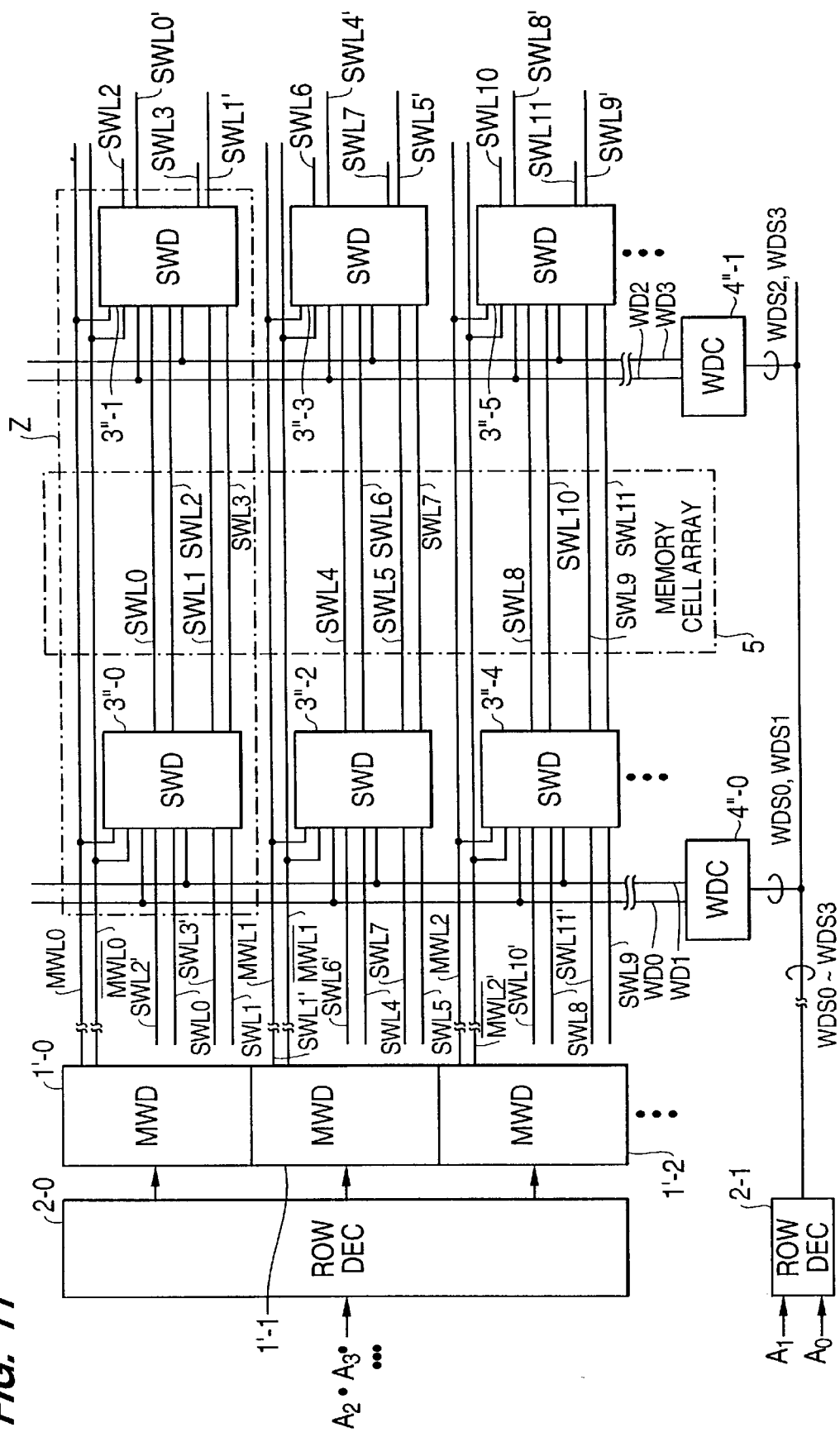
FIG. 11 is a block circuit diagram illustrating a second embodiment of the DRAM device according to the present invention.

In FIG. 11, which illustrates a second embodiment of the present invention, main word line drive circuits 1'-0, 1'-1, ... are provided instead of the main word line drive circuits 1-0, 1-1, ... of FIG. 6. The main word line drive circuits 1'-0, 1'-1, ... generate complementary signals for main word lines $\overline{MWL0}$, $\overline{MWL1}$, ... in addition to the main word lines MWL0, MWL1, .... Also, sub word line drive circuits 3"-0, 3"-1, ... are provided instead of the sub word line drive circuits 3'-0, 3'-1, ... of FIG. 6. Further, sub word line drive signal control circuits 4"-0 and 4"-1 are provided instead of the sub word line drive signal control circuits 4'-0 and 4'-1, respectively, of FIG. 6.

The sub word line drive signal control circuit 4"-0 generates only the sub word line drive signals WD0 and WD1, and the sub word line drive signal control circuit 4"-1 generated only the sub word line drive signals WD2 and WD3.

The sub word line drive circuits 3"-0, 3"-1, ... receive the voltages of the main word line drive signals $\overline{MWL0}$, $\overline{MWL1}$, ... instead of the sub word line drive signals $\overline{WD0}$, $\overline{WD1}$, ... as reset signals.

The sub word line drive circuits 3"-0 and 3"-1 of FIG. 11 are explained next with reference to FIG. 12 which is a detailed circuit diagram of a circuit indicated by Z in FIG. 11.

The sub word line drive circuit 3"-0 includes only the transistors Q01, Q03, Q04, Q05, Q11, Q13, Q14 and Q15. That is, the transistors Q02, Q06, Q12 and Q16 of FIG. 7 are not provided. The transistors Q04, Q05, Q14 and Q15 are controlled by the main word line drive signal $\overline{MWL0}$. Also, the sub word line drive circuit 3"-1 includes only the transistors Q21, Q23, Q24, Q25, Q31, Q33, Q34 and Q35. That is, the transistors Q22, Q26, Q32 and Q36 are not provided. The transistors Q24, Q25, Q34 and Q35 are controlled by the main word line $\overline{MWL0}$.

Figure 12:
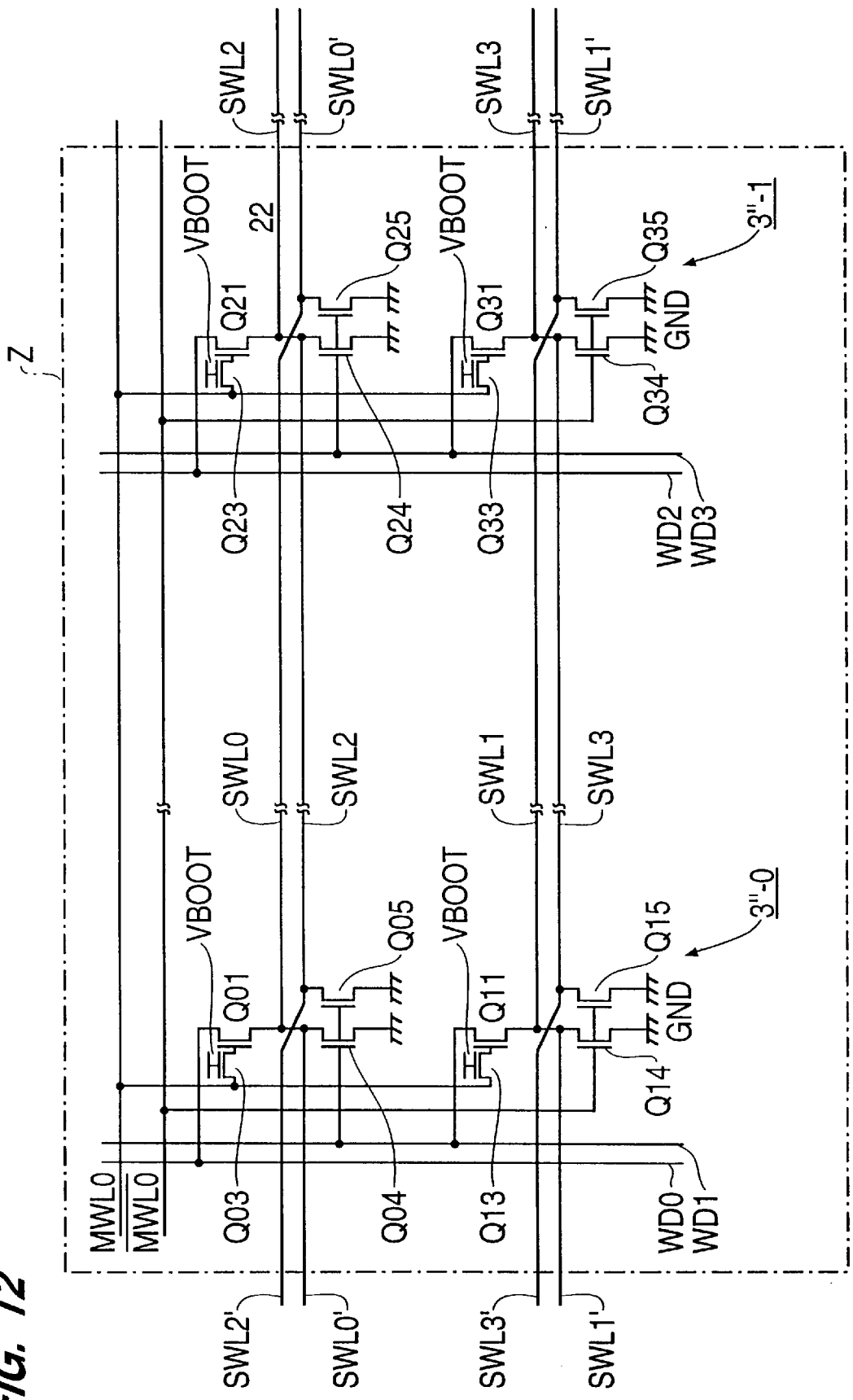
FIG. 12 is a detailed circuit diagram of the circuit Y of FIG. 11.
Figure 13:
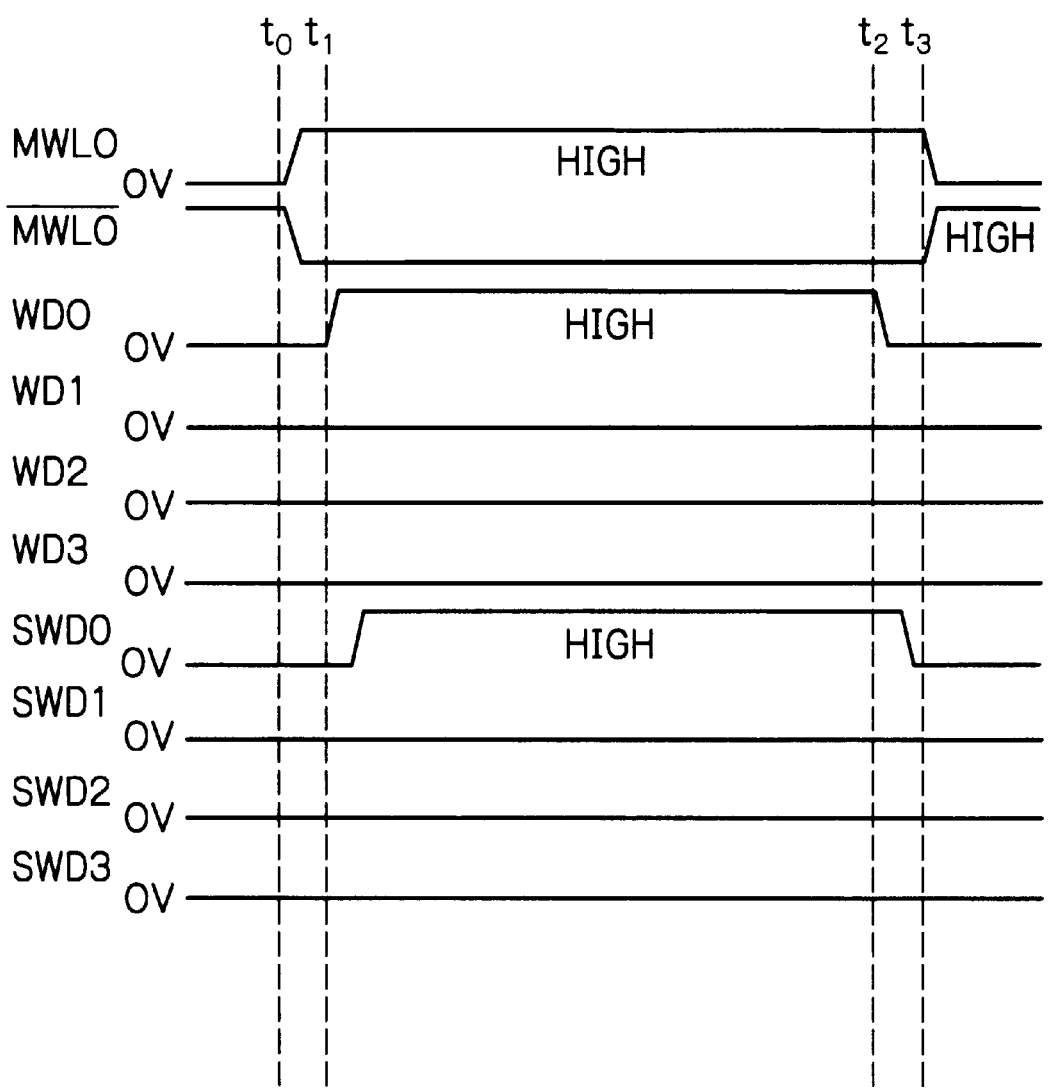
FIG. 13 and 14 are timing diagrams showing the operation of the device of FIG. 12.

The operation of the circuit of FIG. 12 is explained next with reference to FIG. 13. In FIG. 13, assume that the sub word line SWL0 is to be selected.

First, at time t0, the voltage at the main word line MWL1 is caused to go from 0 V to a high level ($>V_{cc}$). Therefore, the voltages at the gates of the transistors Q01, Q11, Q21 and Q31 are increased by the voltage at the main word line MWL0 through the transistors Q03, Q13, Q23 and Q33, so that the transistors Q01, Q11, Q21 and Q31 are turned ON. Simultaneously, the voltage at the main word line $\overline{MWL0}$ is caused to go from the high level to 0 V. As a result, the transistors Q04, Q05, Q14, Q15, Q24, Q25, Q34 and Q35 are turned OFF.

Next, at time t1, the voltage at the sub word drive signal WD0 rises. In this case, since the voltage at the gate of the transistor Q01 is high by the voltage at the main word line MWL0, the voltage at the gate of the transistor Q01 is boosted due to the presence of the transistor Q03 in accordance with the rise of the voltage of the sub word drive signal WD0. As a result, the sub word line SWL0 is activated, i.e., the voltage at the sub word line SWL0 is increased from the ground level GND to a high level the same as that of the sub word line drive signal WD0. On the other hand, since the sub word line drive signals WD1, WD2 and WD3 whose voltages are 0 V are supplied by the turned ON transistors Q11, Q21 and Q31 to the sub word lines SWL1, SWL2 and SWL3, respectively, the voltages at the sub word lines SWL1, SWL2 and SWL3 remain at 0 V.

Next, at time t2, the voltage at the sub word line drive signal WD0 falls. As a result, charges flow from the sub word line SWL0 via the transistor Q01 to the line of the sub word line drive signal WD0, so that the sub word line SWL0 around the sub word line drive circuit 3"-0 is pulled down to the ground level GND. Thus, the sub word line SWL0 is deactivated.

Finally, at time t3, the voltage at the main word line MWL0 is caused to go from 0 V to the high level. As a result, charges flow from the sub word line SWL0 via the transistors Q04 and Q25 to the ground level GND, so that the sub word line SWL0 around the sub word line drive circuit 3"-1 is clamped to the ground level GND. Thus, the voltage at the sub word line SWL0 is clamped to the ground level. Simultaneously, the transistors Q05, Q14, Q15, Q24, Q34 and Q35 are turned ON. Thus, the fluctuation of the voltage at the sub word line SWL0 around the sub word line drive circuit 3"-1 due to the noise is suppressed, so that the sub word line SWL0 can be securely clamped to the ground level GND.

Figure 14:
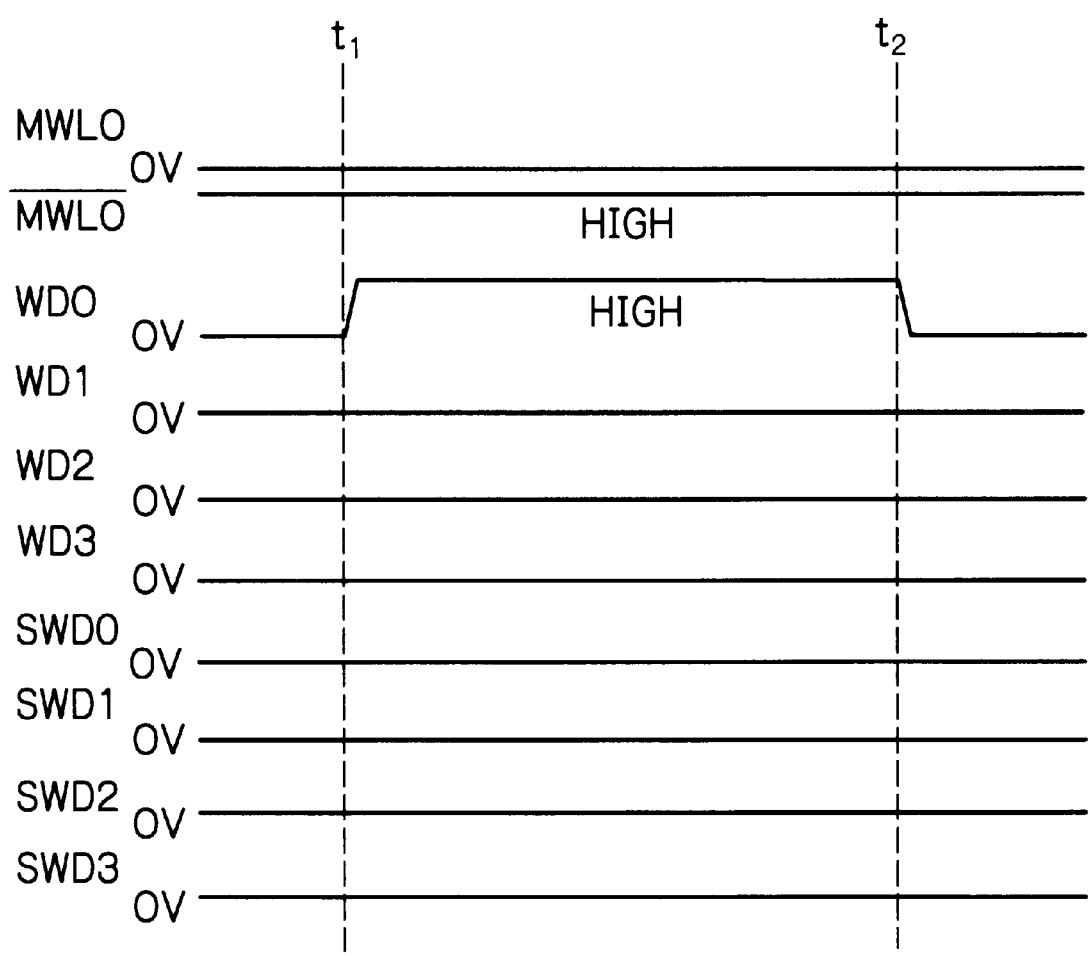

The operation of the circuit of FIG. 12 is explained next with reference to FIG. 14. In FIG. 14, assume that the main word line MWL0 is not selected.

First, at time t1, the voltage at the sub word drive signal WD0 rises. In this case, since the voltage at the main word line MWL0 is 0 V, the transistors Q01, Q11, Q21 and Q31 are turned OFF. On the other hand, since the voltage at the main word line $\overline{MWL0}$ is high, the transistors Q04, Q05, Q14, Q15, Q24. Q25, Q34 and Q35 are turned ON. Therefore, the sub word line SWL1 is clamped by the turned ON transistors Q14 and Q35 to the ground level GND. Further, the sub word line SWL2 is clamped by the turned ON transistors Q05 and Q24 to the ground level GND. Still further, the sub word line SWL3 is clamped by the turned ON transistors Q15 and Q34 to the ground level GND.

Finally, at time t2, the voltage at the sub word line drive signal WD0 falls. Even in this case, the transistors Q04, Q05, Q14, Q15, Q24, Q25, Q34 and Q35 are turned ON. Thus, the fluctuation of the voltage at the sub word line SWL0 around the sub word line drive circuit 3"-1 due to the noise is suppressed, so that the sub word line SWL0 can be securely clamped to the ground level GND.

As explained hereinabove, according to the present invention, since the sub word lines are reset on both sides thereof without special connections for reset operations, the reset time can be decreased, which can increase the access speed without decreasing the integration. In addition, the fluctuation of the voltage of the non-selected sub word lines due to the noise can be suppressed.

I claim:

1. A semiconductor memory device comprising:
    a plurality of main word lines;
    a plurality of pairs of first and second sub word lines;
    a plurality of first sub word line drive circuits, each connected to one of said main word lines and at least two pairs of said pairs of first and second sub word lines, for activating and deactivating on of said first sub word lines and deactivating said second sub word lines in accordance with voltages at said main word lines and first sub word line drive signals; and
    a plurality of second sub word line drive circuits, each connected to one of said main word lines and at least two pairs of said pairs of first and second sub word lines, for activating and deactivating one of said second sub word lines and deactivating said first sub word lines in accordance with voltages at said main word lines and second sub word line drive circuits.

2. The device as set forth in claim 1, further comprising a memory cell array connected to said first and second sub word lines and located between said first and second sub word line drive circuits.

3. The device as set forth in claim 1, wherein, when one of said first sub word line drive circuits activates one of said first sub word lines, one of said second sub word line drive circuits does not deactivate said one of said first sub word lines, and
    wherein, one of said first sub word line drive circuits deactivates one of said first sub word lines, one of said second sub word line drive circuits deactivates said one of said first sub word lines.

4. The device as set forth in claim 1, wherein, when one of said second sub word line drive circuits activates one of said second sub word lines, one of said first sub word line drive circuits does not deactivating said one of said second sub word lines, and
    wherein when one of said second sub word line drive circuits deactivates one of said second sub word lines, one of said first sub word line drive circuits deactivates said one of said second sub word lines.

5. The device as set forth in claim 1, wherein each of said first sub word line drive circuits comprises:
    a first transistor connected between one of first sub word line drive signal lines and one of said first sub word lines and controlled by a voltage at one of said main word lines;
    a second transistor connected between said one of said main word lines and said one of said first sub word lines and controlled by a voltage at said one of said first sub word line drive signal lines;
    a third transistor connected between a gate of said first transistor and said one of said main word lines, a predetermined voltage being applied to a gate of said third transistor;

a fourth transistor connected between said one of said first sub word lines and a power supply terminal and controlled by a voltage at a complementary line of said one of said first sub word line drive signal lines;

a fifth transistor connected between said one of said second sub word lines and said complementary line and controlled by the voltage at said one of said first sub word line drive signal lines.

6. The device as set forth in claim 5, further comprising a NOR circuit having two inputs for receiving one of said first sub word line drive signals and one of said second sub word line drive signals and an output connected to said complementary line.

7. The device as set forth in claim 1, wherein each of said second sub word line drive circuits comprises:

a first transistor connected between one of second sub word line drive signal lines and one of said second sub word lines and controlled by a voltage at one of said main word lines;

a second transistor connected between said one of said main word lines and said one of said second sub word lines and controlled by a voltage at said one of said second sub word line drive signal lines;

a third transistor connected between a gate of said first transistor and said one of said main word lines, a predetermined voltage being applied to a gate of said third transistor;

a fourth transistor connected between said one of said second sub word lines and a power supply terminal and controlled by a voltage at a complementary line of said one of said second sub word line drive signal lines;

a fifth transistor connected between said one of said first sub word lines and said power supply terminal and controlled by the voltage at said complementary line; and a sixth transistor connected between said one of said first sub word lines and said complementary line and controlled by the voltage at said one of said second sub word line drive signal lines.

8. The device as set forth in claim 7, further comprising a NOR circuit having two inputs for receiving one of said first sub word line drive signals and one of said second sub word line drive signals and an output connected to said complementary line.

9. The device as set forth in claim 1, further comprising a plurality of complementary main word lines of said main word lines, each of said first sub word line drive circuits comprising:

a first transistor connected between one of sub word line drive signal lines and one of said first sub word lines and controlled by a voltage at one of said main word lines;

a second transistor connected between said one of said first sub word lines and a power supply terminal and controlled by a voltage at one of said complementary main word lines; and a third transistor connected between said one of said second sub word lines and said power supply terminal and controlled by the voltage at said one of said complementary main word lines.

10. The device as set forth in claim 1, further comprising a plurality of complementary main word lines of said main word lines, each of said second sub word line drive circuits comprising:

a first transistor connected between one of sub word line drive signal lines and one of said second sub word lines and controlled by a voltage at one of said main word lines;

a second transistor connected between said one of said second sub word lines and a power supply terminal and controlled by a voltage at one of said complementary main word lines; and a third transistor connected between said one of said first sub word lines and said power supply terminal and controlled by the voltage at said one of said complementary main word lines.

* * * * *